(12) United States Patent  
Laude

(10) Patent No.: US 7,367,512 B2
(45) Date of Patent: May 6, 2008

(54) CHIP CARD

(75) Inventor: Guntram Laude, Stuhr (DE)

(73) Assignee: Novacard Informationssysteme GmbH, Oldenburg (DE)

( * ) Notice: Subject to any disclaimer, the term of this patent is extended or adjusted under 35 U.S.C. 154(b) by 45 days.

(21) Appl. No.: 10/875,638

(22) Filed: Jun. 24, 2004

(65) Prior Publication Data

US 2005/0194451 A1 Sep. 8, 2005

(30) Foreign Application Priority Data

Mar. 4, 2004 (DE) .................. 20 2004 003 554 U

(51) Int. Cl.
*G06K 19/06* (2006.01)

(52) U.S. Cl. ...................... 235/492; 235/488; 235/441; 235/487; 361/737

(58) Field of Classification Search ................ 235/492, 235/488, 441, 487; 361/737
See application file for complete search history.

(56) References Cited

U.S. PATENT DOCUMENTS

| | | | |
|---|---|---|---|
| 4,511,796 A * | 4/1985 | Aigo ........................... 235/492 |
| 5,151,774 A | 9/1992 | Mori et al. |
| 5,420,757 A | 5/1995 | Eberhardt et al. |
| 5,550,402 A | 8/1996 | Nicklaus |
| 5,559,370 A | 9/1996 | Berney |
| 5,682,294 A * | 10/1997 | Horejs et al. ................ 361/737 |
| 5,703,350 A * | 12/1997 | Suhir .......................... 235/492 |
| 5,777,316 A | 7/1998 | Horie et al. |
| 5,809,633 A * | 9/1998 | Mundigl et al. .............. 29/600 |
| 5,894,006 A * | 4/1999 | Herbst ......................... 264/132 |
| 5,991,159 A * | 11/1999 | Kraiczyk ..................... 235/492 |
| 6,076,737 A * | 6/2000 | Gogami et al. .............. 235/492 |
| 6,160,526 A * | 12/2000 | Hirai et al. .................. 235/491 |
| 6,239,976 B1 * | 5/2001 | Templeton et al. ......... 361/737 |
| 6,440,773 B1 * | 8/2002 | Usami ........................ 438/107 |
| 2002/0023962 A1 * | 2/2002 | Fischer ....................... 235/492 |
| 2004/0206829 A1 * | 10/2004 | Welling et al. .............. 235/492 |

FOREIGN PATENT DOCUMENTS

| | | |
|---|---|---|
| DE | 41 35 512 C2 | 5/1992 |
| DE | 197 51 043 C2 | 6/1999 |
| DE | 694 26 053 T2 | 10/2000 |
| EP | 0 469 970 | 2/1992 |
| EP | 05 99 194 A1 | 6/1994 |
| FR | 2 538 930 | 7/1984 |
| WO | WO 99/42953 A1 | 8/1999 |

* cited by examiner

*Primary Examiner*—Michael G. Lee
*Assistant Examiner*—Allyson N Trail
(74) *Attorney, Agent, or Firm*—Collard & Roe, P.C.

(57) ABSTRACT

A chip card with a flexible card body and electrical components arranged in the card body with at least some of the electrical components being arranged in a casing. The card body has a recess matched in shape and size to the casing and the casing is affixed moveably in the recess of the card body. In this way, the conventionally existing incompatibility of rigid casing and flexible card body can be solved. As a result of the moveable suspension, the casing is decoupled from the bending and torsion forces acting on the card body.

15 Claims, 4 Drawing Sheets

CHIP CARD

BACKGROUND OF THE INVENTION

1. Field of the Invention

The invention relates to a chip card with a flexible card body and electrical components arranged in the card body.

2. The Prior Art

During the manufacture of chip cards of the type specified above, especially DIN/ISO chip card bodies, three different techniques are conventionally used to integrate components of complex electronic circuits in the card bodies.

The generally known chip card is the simplest example for an implantation of electronic components in a card body. In this case, the circuit-carrying silicon is glued to the underside of the substrate, bonded and potted. Through contacts to the upper side of the substrate allow electrical contact to a peripheral system, especially a card reader. This so-called chip module is finally implanted in a plastic card body. The card body is merely the carrier of the electronic system without its own electronic properties or functions.

Whereas with implantation the electronic components are visible from outside, a slightly changed situation arises for the manufacture of so-called contactless cards. In this case, the chip module should not be visible. For this purpose, an already equipped circuit carrier, which is especially equipped with an antenna and a chip, is laminated into the central card plane. The substrate of the circuit carrier generally consists of the same material as the remaining card body so that a largely homogeneous material bonding is achieved as a result of the lamination. Mainly thermoplastics are used here, such as polyvinyl chloride (PVC), acrylonitrile butadiene styrene (ABS), polycarbonate (PC) and polyethylene terephthalate (PET). In cases where substrate and card material have significantly different properties, so-called adhesion promoters are used with which at least one of the bonding partners is coated. In the lamination method different films are placed over one another in a defined sequence and fastened. This film stack is then laminated between two sheets under pressure and temperature to give an approximately homogeneous material. However, if large-area silicon chips, especially silicon chips having an area of more than 20 mm$^2$ are to be processed, this is barely possible using the lamination method. Especially if other components are to be integrated, this would result in a very complex structure of substrates, core films, spacer films, adhesion promoters and similar.

SUMMARY OF THE INVENTION

The object of the invention is to provide a chip card of the type specified initially in which electrical components having comparatively large dimensions can be accommodated on a flexible card body.

This object is achieved by a chip card with a flexible card body and electrical components arranged in the card body with at least some of the electrical components being arranged in a casing. The card body has a recess matched in shape and size to the casing and the casing is affixed moveably in the recess of the card body. In this way, the conventionally existing incompatibility of rigid casing and flexible card body can be solved. As a result of the moveable suspension, the casing is decoupled from the bending and torsion forces acting on the card body.

The casing preferably has a metal frame surrounding the electrical components arranged therein. An especially high strength can thereby be achieved. The casing is preferably constructed as resistant to bending. The casing is preferably made of stainless steel, ceramic or fibre-reinforced plastic. It consists of a lower section and an upper section. After the electronic components have been inserted in the casing, the casing is preferably potted.

The casing and the card body are preferably interconnected in at least two regions. If merely two connecting regions are provided, these should be constructed as suitably stiff so that complete twisting of the casing in the card body is prevented. The casing and the card body are preferably interconnected in three regions. In this case, the regions preferably each enclose an angle of 120° to one another. By means of such fixings the casing can be movably suspended in the card body. The casing is preferably connected to the card body using suspension lugs. The connection between the chip card and casing is preferably membrane-like. In another preferred embodiment, the membrane-like connection between chip card and casing can be constructed as encircling around the entire casing.

In a preferred embodiment of the invention, each recess is constructed as passing through the card body. Preferably the casing is then constructed with a thickness which corresponds to the thickness of the remaining card so that a through surface is initially formed. During any bending of the card body the bending-resistant casing will then be slightly twisted in its moveable support with respect to the card body. Alternatively it is also possible to construct the recess not completely through the card body, i.e., to provide residual layers remaining either on one side or on both sides in the card body. Then however, the casing must be somewhat smaller than the recess thus formed to ensure some mobility inside this recess.

In another preferred further development of the invention the electrical components arranged in the casing are connected to a flexible circuit carrier. The flexible circuit carrier preferably also forms a mechanical connection between the casing and the card body. At the same time, the flexible circuit carrier can also be used to produce an electrical connection between casing and card body. The flexible circuit carrier is preferably formed such that it is substantially matched to the shape of the casing and in addition, outwardly extending connecting regions are preferably provided thereon. In this case, three connecting regions are preferably provided, of which one extends as far as a chip module to produce an electrical connection. The electronic components are in this case arranged on the flexible circuit carrier, the equipped part of the circuit carrier is then integrated in the casing. In various areas, the unequipped circuit carrier leaves the casing in a fashion such that it produces an electrical connection to the contact chip module in one or a plurality of regions and on the other hand forms suspension lugs which then implement the membrane-like suspension. Some suspension lugs exclusively form a mechanical connection while others form a mechanical and an electrical connection.

According to another preferred embodiment of the invention, the electrical components arranged in the casing are exclusively electrically interconnected to one another, as an independent circuit arranged in the casing. A coil is preferably then formed in the card body which is constructed for contactless energy transmission to the electrical components of the casing. Such chip cards are also known as hybrid chip cards. A circuit carrier provided in the casing has suspension lugs or connecting regions with exclusively mechanical function. These connecting lugs are then free from electrical connections to any electrical components of the chip card arranged outside the casing.

In another preferred embodiment, the casing has stiffening cross-pieces. These are preferably matched in their position and size to the electrical components arranged in the casing. The circuit carrier preferably has recesses for these stiffening cross-pieces of the casing. The circuit carrier can thus be inserted quite simply into the casing. The casing is preferably round. Such a casing can be integrated especially easily and also configured as movable without it being able to tilt. Other, especially elliptic or oval configurations of the casing, in some cases even angular shapes, are also possible. The casing is preferably dimensioned such that it occupies about 5% to 25%, especially 8% to 15% and in a preferred embodiment 10% to 13% of the area of the chip card. It is thereby achieved that the chip card remains flexible in its main region and only a comparatively small region is constructed as a rigid casing block or as a pin The chip card is preferably produced by a sandwich method. In the sandwich method an already assembled electronic unit is fixed on a ready-laminated card lower section and the likewise ready-laminated card upper section is then glued to the card lower section to form a complete card body. In another preferred embodiment of the invention, the chip card is produced using an injection molding method.

Another aspect of the invention consists in providing a casing with electrical components contained therein for use in a chip card of the type described above. Furthermore, it is an aspect of the invention to provide a casing to receive electrical components for use in a chip card described above.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1:
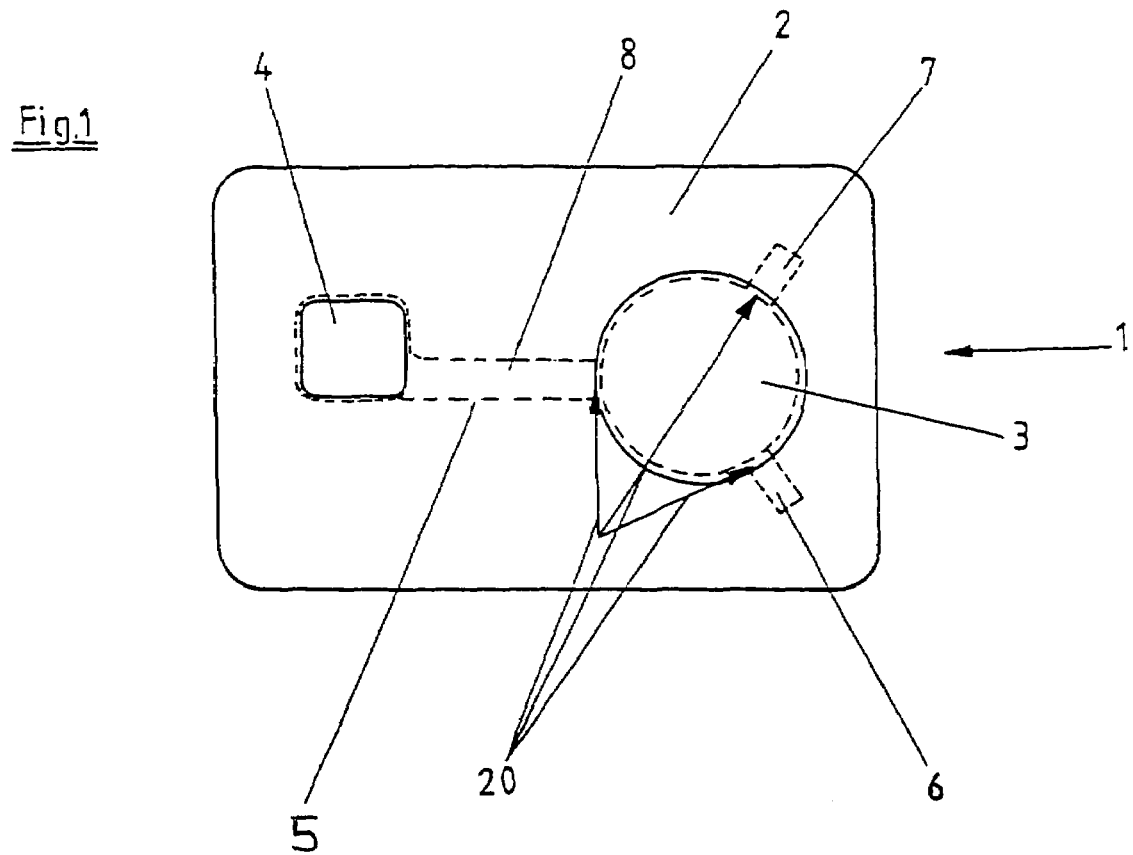
FIG. 1 is a plan view of a chip card according to the invention.

Referring now in detail to the drawings, FIG. 1 shows a plan view of a chip card 1 which substantially has a flexible card body 2, a chip module 4 inserted therein and a casing 3. Casing 3 is provided to receive one or a plurality of electrical components. These can, for example, be a battery, a keypad, a display, fingerprint sensors or a large-area controller chip. Provided in the card body 2, as shown dotted, is a circuit carrier 5 which extends through the casing 3 and forms three suspension lugs 6, 7 and 8 beyond casing 3. Suspension lug 8 is constructed as lengthened and at the same time forms an electrical connection to chip module 4. Provided in card body 2 is a recess or hollow which extends from top to bottom completely through card body 2 and in which casing 3 is arranged. Between casing 3 and card body 2 there remains a small gap so that casing 3 can move tilt-free relative to card body 2.

Figure 2:
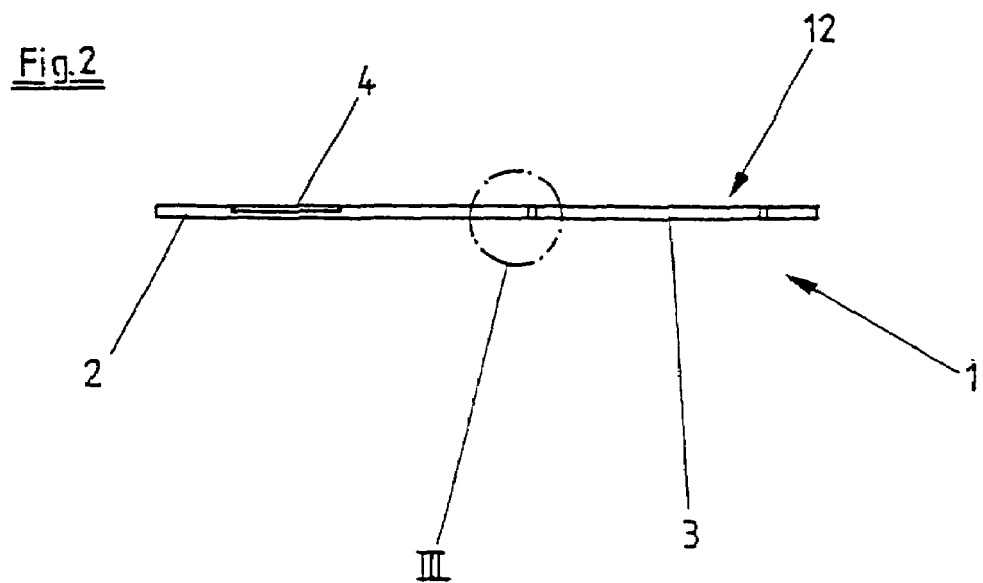
FIG. 2 is a side view of a chip card according to the invention from FIG. 1.

FIG. 2 shows a side view of chip card 1 from FIG. 1. It can be seen that card body 2 as a whole is constructed very flat and that especially recess 12 is constructed such that it goes through the entire card body 2. Arranged in this recess is casing 3 whose thickness corresponds to the thickness of card body 2. Chip module 4 is constructed over a part region of the depth of card body 2 and is connected to the casing by means of circuit carrier 5.

Figure 3:
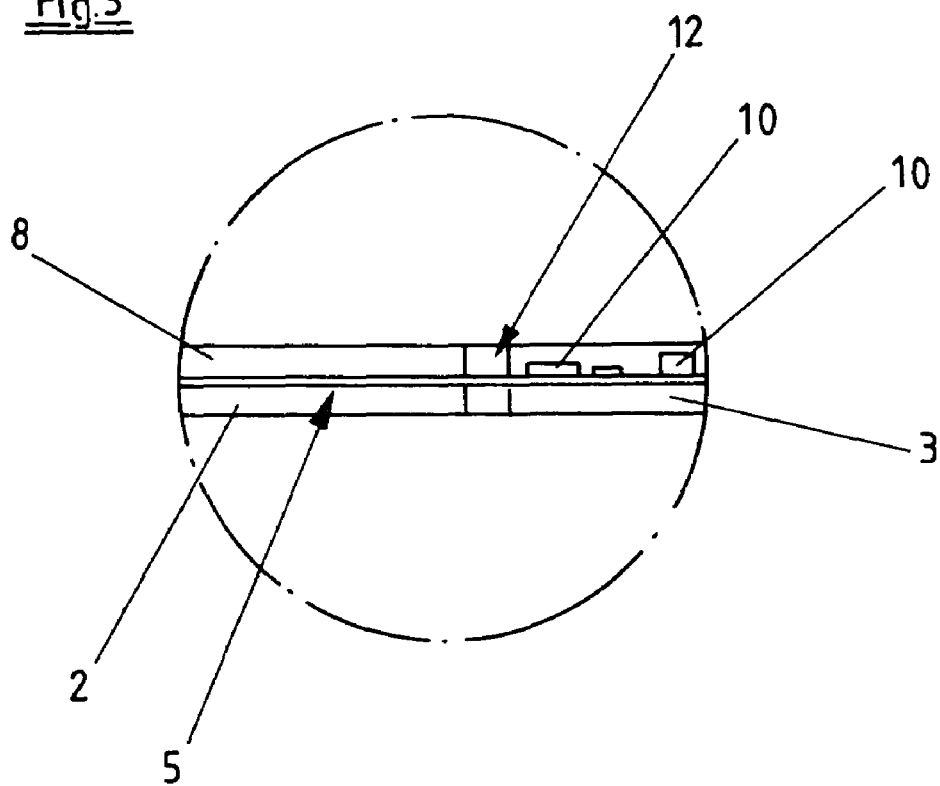
FIG. 3 is an enlarged section of an unloaded chip card from FIG. 2.

FIG. 3 shows an enlarged section according to III in FIG. 2. The chip card is shown unloaded or in the unbent state. Connecting region 8 of circuit carrier 5 which extends through card body 2, can be seen in the left-hand region of FIG. 3. Circuit carrier 5 extends into casing 3 in which electrical components 10 are arranged. In an intermediate region or a remaining gap between casing 3 and card body 2 the connection is only made through circuit carrier 5. Here casing 3 is suspended in membrane fashion in card body 2. The edge region shown here can also be designated as membrane zone 20.

Figure 4:
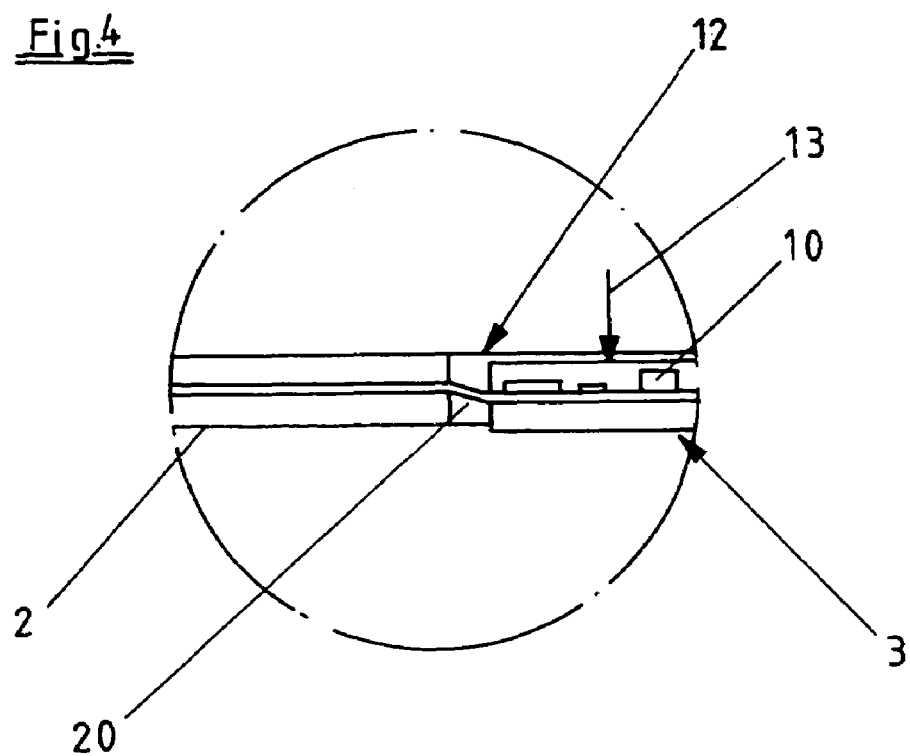
FIG. 4 is an enlarged section of a loaded chip card from FIG. 2.

FIG. 4 shows the same region as in FIG. 3 but here casing 3 is acted upon by a force F in the direction of the arrow 13. Casing 3 in this case is displaced downwards with respect to the card body 2 and is thus no longer arranged flush with the recess 12 but on the underside projects slightly from the recess 12. In the transition region between card body and casing in which there is a connection by means of the circuit carrier 8, a bending of the circuit carrier 5 can be identified. Membrane zone 20 is formed here.

Figure 5:
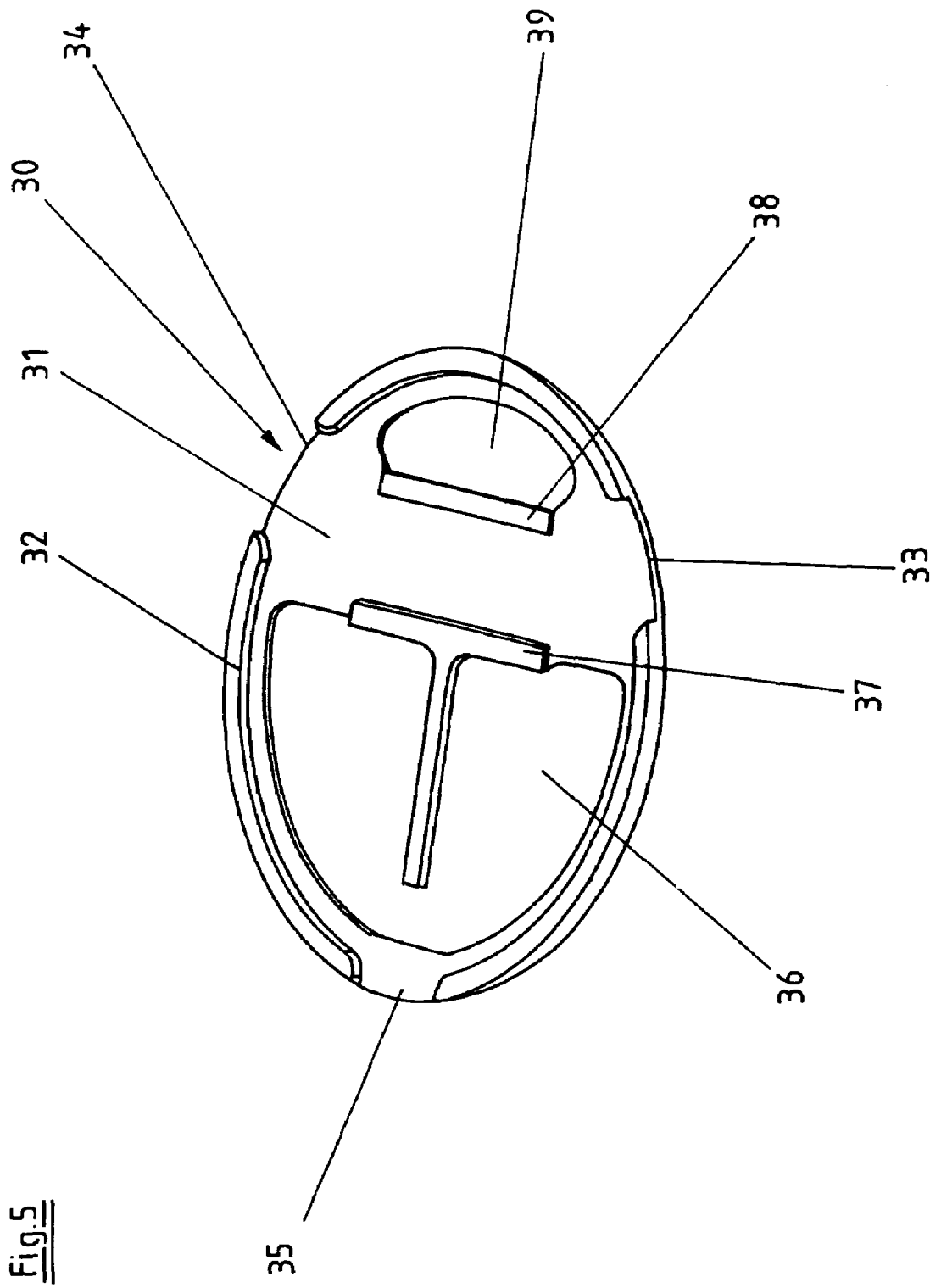
FIG. 5 is a perspective view of a base of a casing of a chip card according to the invention.

FIG. 5 shows a perspective view of a base 30 of casing 3. In order to produce casing 3 a flat lid, not shown here, must be placed on base 30. Base 30, also called a pot, has an encircling edge 32 in the outer region which serves as a contact surface for the lid. Edge 32 has three openings or recesses 33, 34 and 35 which are each arranged at an angle of 120° with respect to one another and can be guided out from the casing through the fixing lugs or suspension lugs to the case body. Furthermore, base 30 has slightly deepened regions 36 and 39 and reinforcing cross-pieces 37 and 38 arranged in the edge region of these deepened regions, whose size and position are selected depending on the electrical components to be received or placed in the casing.

Figure 6:
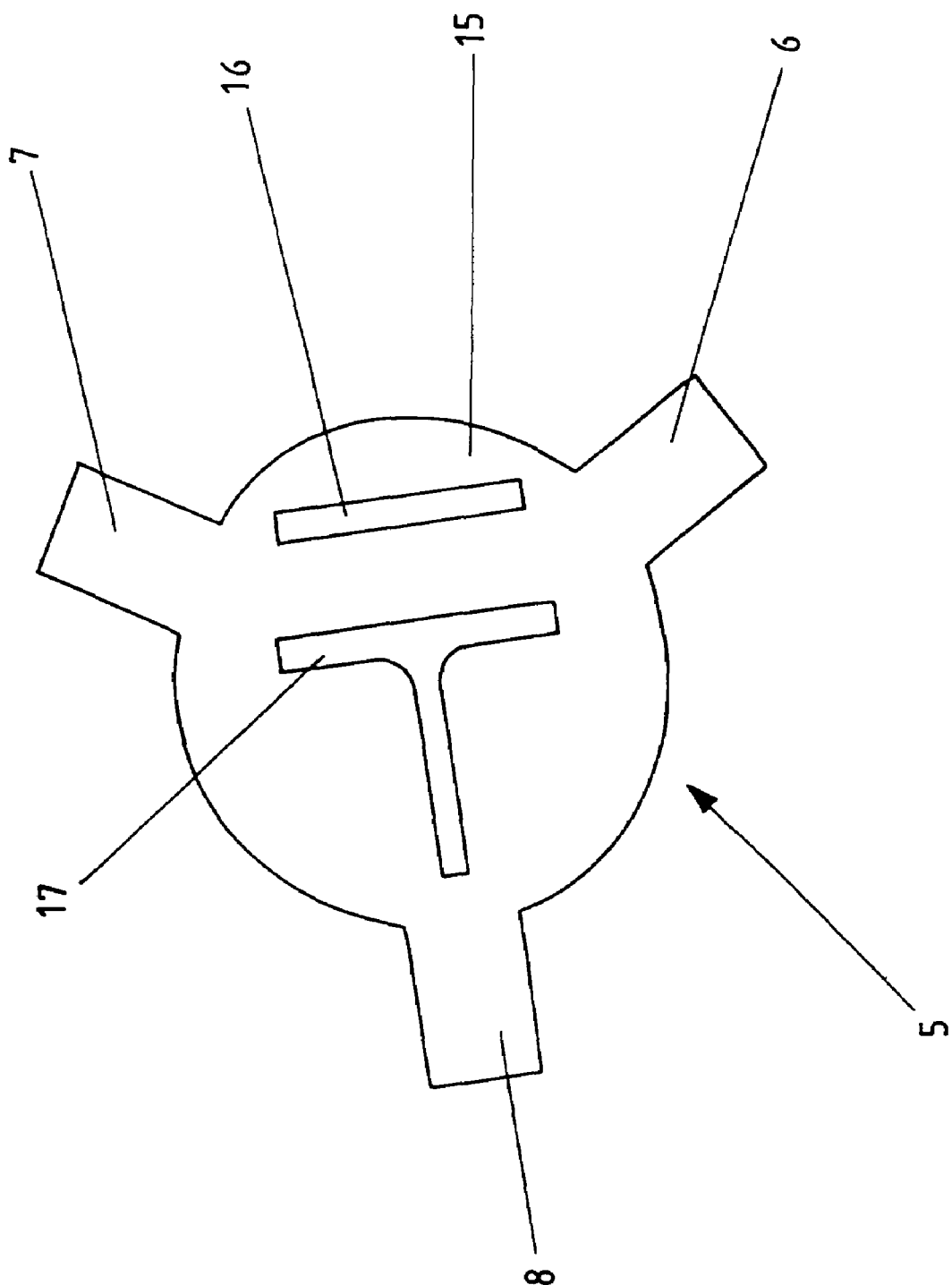
FIG. 6 is a plan view of a part of a circuit carrier for use in a chip card according to the invention.

FIG. 6 shows a circuit carrier 5 which is matched to base 30 of the casing shown in FIG. 5. In addition to the round base surface 15 matched to the shape of base 30 of the casing, the circuit carrier 5 also has suspension lugs 6, 7 and 8. Recesses 16 and 17 whose size, position and dimensions are matched to reinforcing cross-pieces 37 and 38, are provided in the inner area.

Accordingly, while only a few embodiments of the present invention have been shown and described, it is obvious that many changes and modifications may be made thereunto without departing from the spirit and scope of the invention.

What is claimed is:

1. A chip card comprising:
a flexible card body;
electrical components arranged in the card body, wherein at least some of the electrical components are arranged in a casing;
a recess in the card body, said recess being matched in shape and size to the casing, wherein the casing is movable in the recess of the card body and wherein the recess passes entirely through the card body, such that the casing is decoupled from bending and torsion forces acting on the card body.

2. The chip card according to claim 1, wherein the casing is rigid and resistant to bending.

3. The chip card according to claim 1, wherein the casing and the card body are interconnected in at least two regions.

4. The chip card according to claim 1, wherein the casing and the card body are interconnected in three regions which each enclose an angle of around 120°.

5. The chip card according to claim 1, wherein the casing and the card body are interconnected in a membrane fashion.

6. The chip card according to claim 1, wherein the electrical components arranged in the casing are connected to a flexible circuit carrier.

7. The chip card according to claim 6, wherein the flexible circuit carrier forms a mechanical connection between casing and card body.

8. The chip card according to claim 6, wherein the circuit carrier has a shape that is substantially matched to a shape of the casing and wherein the circuit carrier has outwardly extending connecting regions.

9. The chip card according to claim 1, wherein the casing has reinforcing cross-pieces.

10. The chip card according to claim 9, wherein the circuit carrier has recesses for the reinforcing cross-pieces of the casing.

11. The chip card according to claim 1,
wherein the electrical components arranged in the casing are exclusively electrically connected to one another.

12. The chip card according to claim 1, wherein the casing is round.

13. The chip card according to claim 1, wherein the casing occupies about 5% to 25% of the area of the chip card.

14. The chip card according to claim 1, wherein the chip card is produced by a sandwich method.

15. The chip card according to claim 1, wherein the chip card is produced by an injection molding method.

* * * * *